United States Patent
Kothandapani

(10) Patent No.: US 8,975,176 B2
(45) Date of Patent: Mar. 10, 2015

(54) GOLD DIE BOND SHEET PREFORM

(71) Applicant: Materion Corporation, Mayfield Heights, OH (US)

(72) Inventor: Ramesh Kothandapani, Singapore (SG)

(73) Assignee: Materion Corporation, Mayfield Heights, OH (US)

( * ) Notice: Subject to any disclaimer, the term of this patent is extended or adjusted under 35 U.S.C. 154(b) by 0 days.

(21) Appl. No.: 14/205,403

(22) Filed: Mar. 12, 2014

(65) Prior Publication Data

US 2014/0264949 A1    Sep. 18, 2014

Related U.S. Application Data

(60) Provisional application No. 61/793,751, filed on Mar. 15, 2013.

(51) Int. Cl.
*H01L 21/44*     (2006.01)
*H01L 23/00*     (2006.01)

(52) U.S. Cl.
CPC ............... *H01L 24/09* (2013.01); *H01L 24/03* (2013.01); *H01L 24/27* (2013.01); *H01L 24/29* (2013.01); *H01L 24/32* (2013.01); *H01L 2224/32013* (2013.01); *H01L 2224/2746* (2013.01); *H01L 2224/27334* (2013.01); *H01L 24/83* (2013.01); *H01L 2224/29144* (2013.01); *H01L 2224/32245* (2013.01); *H01L 2224/83192* (2013.01); *H01L 2224/83444* (2013.01); *H01L 2224/83447* (2013.01); *H01L 2224/83815* (2013.01);

(Continued)

(58) Field of Classification Search
CPC ........... H01L 2924/01029; H01L 2924/01013; H01L 2924/01079
USPC ............... 257/E23.02, E23.023, E23.04, 503, 257/781–786, 778; 438/117, 118, 121, 612, 438/614, 666
See application file for complete search history.

(56) References Cited

U.S. PATENT DOCUMENTS 3,258,898 A * 7/1966 Garibotti .................. 29/832
3,495,322 A    2/1970 Goldstein
3,660,632 A    5/1972 Leinkram (Continued)

FOREIGN PATENT DOCUMENTS

EP    0 890 989    1/1999
GB    1 190 290 A    4/1970

(Continued)

OTHER PUBLICATIONS

International Search Report, dated Apr. 14, 2008 in connection with PCT/US2007/080552.

(Continued)

*Primary Examiner* — Chris Chu
(74) *Attorney, Agent, or Firm* — Richard M. Klein; Fay Sharpe LLP

(57) ABSTRACT

The amount of gold required for bonding a semiconductor die to an electronic package is reduced by using a sheet preform tack welded to the package prior to mounting the die. The preform, only slightly larger than a semiconductor die to be attached to the package, is placed in the die bond location and tack welded to the package at two spaced locations.

20 Claims, 4 Drawing Sheets

(52) U.S. Cl.
CPC . *H01L2924/1033* (2013.01); *H01L 2224/2711* (2013.01)
USPC ...... 438/612; 257/E23.04; 257/782; 257/786; 438/118; 438/614

(56) References Cited

U.S. PATENT DOCUMENTS

| | | | | |
|---|---|---|---|---|
| 3,728,090 | A | | 4/1973 | Hoffman et al. |
| 4,181,249 | A | * | 1/1980 | Peterson et al. ............. 228/121 |
| 4,620,215 | A | * | 10/1986 | Lee ............................... 257/713 |
| 4,650,922 | A | * | 3/1987 | McPherson ................... 174/541 |
| 4,872,047 | A | | 10/1989 | Fister et al. |
| 5,037,778 | A | | 8/1991 | Stark et al. |
| 5,136,360 | A | | 8/1992 | Harada et al. |
| 5,411,921 | A | * | 5/1995 | Negoro ......................... 438/118 |
| 5,468,993 | A | * | 11/1995 | Tani ............................... 257/676 |
| 5,622,305 | A | | 4/1997 | Bacon et al. |
| 5,666,004 | A | * | 9/1997 | Bhattacharyya et al. ..... 257/724 |
| 5,667,884 | A | | 9/1997 | Bolger |
| 5,930,666 | A | | 7/1999 | Pankove |
| 6,169,330 | B1 | | 1/2001 | Pankove |
| 7,595,553 | B2 | | 9/2009 | Nagamatsu et al. |
| 8,212,277 | B2 | | 7/2012 | Sakai et al. |
| 2005/0136640 | A1 | | 6/2005 | Hu et al. |

FOREIGN PATENT DOCUMENTS

| | | |
|---|---|---|
| JP | H05-315375 A | 11/1993 |
| WO | WO 2008/045779 | 4/2008 |
| WO | WO 2008/045779 A2 | 4/2008 |

OTHER PUBLICATIONS

Written Opinion of the International Searching Authority, dated Apr. 14, 2008, in connection with PCT/US2007/080552.

Zhang, et al., "The Research for Resistance Spot Welding with Rectangular Electrode," Proceedings of the 2009 IEEE International Conference on Mechatronics and Automation, pp. 2484-2488, (Aug. 9, 2009).

Nippon Avionics, Co., Ltd., "Basic Configuration of a Resistance Welder and the Role of Each Part," Retrieved from the Internet on Jul. 31, 2014: URL: https://web.archive.org/web/20120622172749/http://www.avio.co.jp/english/products/assem/principle/welding/configuration.htm. pp. 1-3 (2012).

Indium Corporation, et al., "Gold Solders," Retrieved from the Internet on Jul. 31, 2014: URL: https://web.archive.org/web/20130302221748/http://www.indium.com/solders/gold/, pp. 1-4, (2013).

International Search Report for PCT/US2014/023872 dated Aug. 8, 2014.

* cited by examiner

GOLD DIE BOND SHEET PREFORM

CROSS-REFERENCE TO RELATED PATENTS AND APPLICATIONS

This application claims priority to and the benefit of the filing date of U.S. Provisional Patent Application Ser. No. 61/793,751, filed Mar. 15, 2013, which application is hereby incorporated by reference.

BACKGROUND

This disclosure relates to the die bonding of semiconductor chips to ceramic or metals, and more particularly, to die bonding of semiconductor chips to semiconductor packages using a gold die bond sheet preform.

Die bonding of semiconductor chips to packages or headers typically involves metalizing the semiconductor package with gold alloy and bonding of the die to the substrate. Die bonding is of critical importance for power devices, for example, that require a high quality die bond to dissipate heat from the package, and, in some cases, provide a low impedance interface between the bottom of the die and the die bond area.

For the package manufacturer the amount of gold plated on to the semiconductor package is an important factor in the cost of the package. The thickness of the gold layer on the package must be enough to provide a secure bond surface for the die attach process. In addition, variations in die types by the same manufacturer when the die is manufactured affects die bond.

Therefore, it can be appreciated that a package that require less gold than conventional packages while still maintaining a comparable level of performance is highly desirable.

Further, a package in which the thickness of the gold at the die bond area can be easily adjusted to accommodate variations in die types and other features is also highly desirable.

INCORPORATION BY REFERENCE

WIPO Patent Publication WO 2008045779 of International Application No. PCT/US2007/080552; applicant, Williams Advanced Materials, Inc.; Inventors Jech, David and Kothandapani, Ramesh is incorporated herein by reference.

BRIEF DESCRIPTION

In accordance with one aspect of the present disclosure, a method of forming a die bond site on a package includes forming a die bond sheet preform, placing the die bond sheet preform on a die bond area of the semiconductor package, and tack bonding the die bond sheet preform to the semiconductor package at more than one location.

Further in accordance with the disclosure, a gold-tin die bond sheet preform is used.

Yet further in accordance with the disclosure, a gold-tin die bond sheet preform is about 0.0005 inch (13 μm) thick.

Still further in accordance with the disclosure, the preform is tack bonded by electric resistance welding to the package by means of an electric current that has a welding current wave form with only one principal current peak.

In accordance with another aspect, a method of forming a semiconductor bond site on a semiconductor package comprises the steps of forming a gold containing die bond sheet preform having a width, a length and a substantially uniform thickness, placing the die bond sheet preform on a die bond area on a semiconductor package, and welding the die bond sheet preform to the package die bond area at two spaced apart spots, the two spaced apart spots having a total area significantly smaller than the area of the sheet preform.

The die bond sheet preform can contain gold and tin. The die bond sheet preform can be about 0.0005 inch thick. The die bond sheet preform can be rolled to a final thickness of 0.0005 inch. The die bond sheet preform can be welded to the package die bond area with an electric current resistance welding using a welding current waveform having only one principal current peak. The welding the die bond sheet preform to the package die bond area includes using a working electrode having a very small contact area (approximately 0.3 mm to 0.5 mm). The method can further include placing a die on the die bond sheet preform, and attaching the die to the package die bond area by at least partially liquefying the die bond sheet preform. The die bond sheet preform can be slightly larger than a footprint of the die. The total area of the spot welds can be approximately 0.4 mm to 0.7 mm.

In accordance with another aspect, a semiconductor package comprises a copper tungsten base having a die bond site and a die bond sheet containing gold and tin welded to the base die bond site in at least two locations spaced from one another.

The die bond sheet can be a preform having a thickness of about 0.0005 inch. The die bond sheet can be spot welded to the base die bond site. The at least two locations can comprise welds having an area of approx. 6.20 mm×2.39 mm.

In accordance with still another aspect, a semiconductor package is formed by forming a gold containing die bond sheet preform having a width, a length and a substantially uniform thickness, placing the die bond sheet preform on a die bond area on a semiconductor package, and welding the die bond sheet preform to the package die bond area at two spaced apart spots, the two spaced apart spots having a total area significantly smaller than the area of the sheet preform.

The die bond sheet preform can be about 0.0005 inch thick. The die bond sheet preform can be rolled to a final thickness. The die bond sheet preform can be welded to the die bond area with an electric current resistance welding using a welding current waveform having only one principal current peak. The die bond sheet preform can be spot welded to the die bond area. The at least two spots can comprise welds having an area of approx. 0.4 mm to 0.7 mm.

BRIEF DESCRIPTION OF THE DRAWINGS

The present disclosure is described with reference to the accompanying drawings, wherein.

Corresponding reference characters indicate corresponding parts throughout the several views. The elements in the drawings have not necessarily been drawn to scale in order to better illustrate the features of the disclosure. The example set out herein illustrates one embodiment of the disclosure but should not be construed a limiting the scope of the disclosure in any manner.

DETAILED DESCRIPTION

Figure 1:
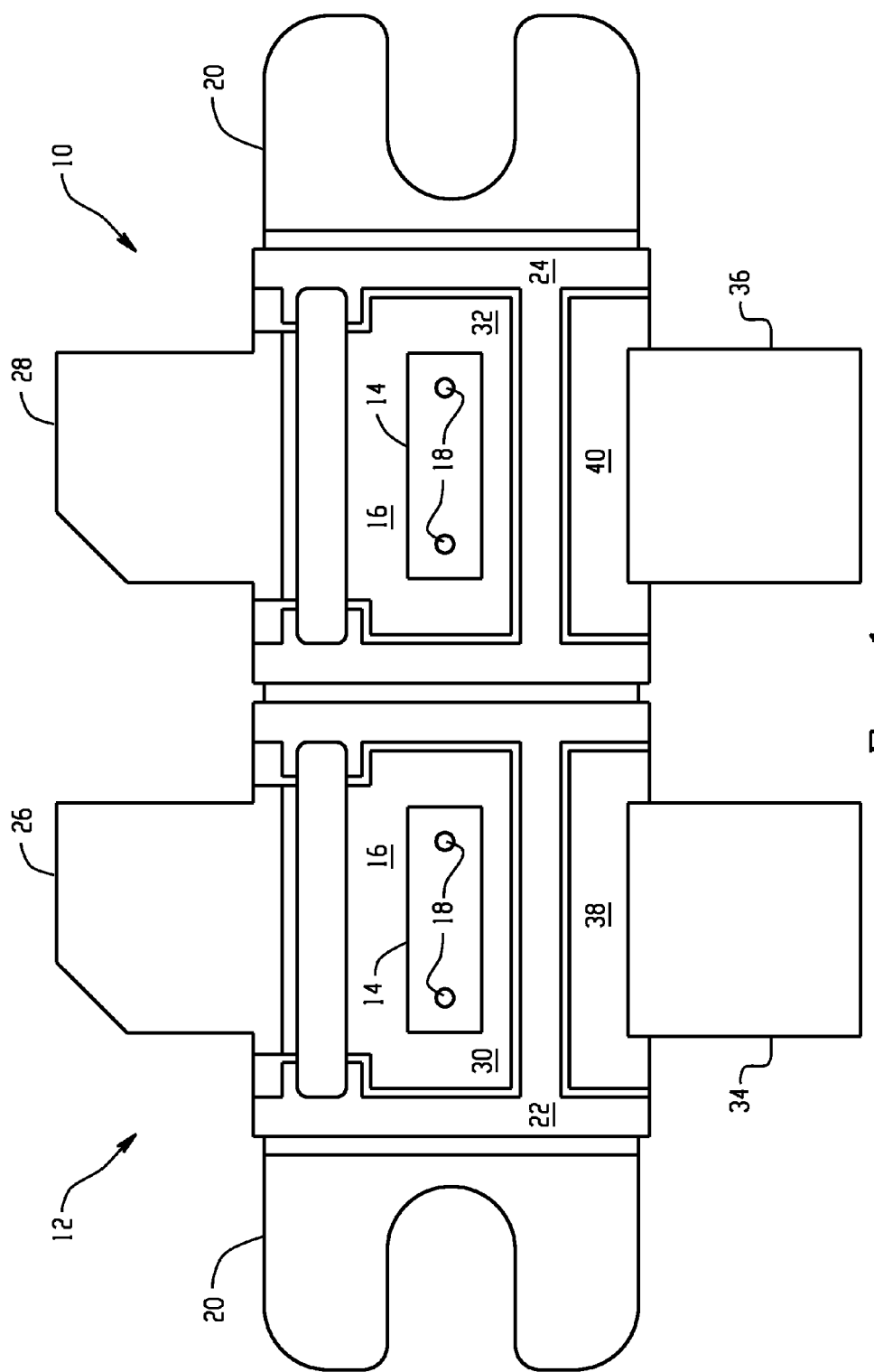
FIG. 1 is a top view of an example package ready to receive semiconductor chips or dies with a gold die bond preform according to the present disclosure.

Referring to FIG. 1, one exemplary embodiment 10 of the present disclosure includes a dual chip package 12 with rectangular gold, or a gold alloy such as AuSn and AuGe, die bond sheet preforms 14 attached to die bond areas 16. The die bond sheet preforms 14 are secured by tack welds 18 with two spaced apart welds for each die bond sheet preform 14. While two spaced apart welds are illustrated, it will be appreciated that more or fewer welds could be used depending on the application. However, in most applications, two spaced apart welds as illustrated is preferred. Each die bond sheet preform 14 is solder that will be used to bond a die to the package 12 in a subsequent step.

The illustrated package 12 (sometimes called a header) has positions for mounting two dies. Other packages or headers have a position for mounting a single semiconductor die only, or more than two dies. Such single and multiple position headers are otherwise identically used in the present disclosure.

The exemplary package or header 12 is a copper-tungsten mix which is often used in headers to provide electrical conductivity, thermal conductivity, and heat resistance. The package 12 has horizontal members 20 which span the width of the package 12 and are electrically connected to conductive regions 22 and 24 on the ceramic. Two upper leads 26 and 28 are electrically and thermally connected to conductive regions 30 and 32 on the package. The conductive regions 30 and 32 include the die bond regions 16. Two lower leads 34 and 36 are electrically and thermally connected to conductive regions 38 and 40.

One exemplary application of the current disclosure is the mounting of gallium nitride semiconductor dies to copper tungsten packages 12. Bonding of gallium nitride to copper tungsten is better if a gold, tin mixture is used as the bonding material (e.g., a preform of gold-tin).

The thickness of the gold-tin die bond sheet preform should be thick enough for a reliable die bond of a semiconductor die to the package 12. The preferred thickness is about 0.0005 inch (13 μm), for example. The gold-tin die bond sheet preform is about the same size as the die or generally only slightly larger than the bottom of the die to be mounted thus minimizing the amount of gold used.

As compared to conventional techniques including gold plating applied to larger areas, the amount of gold used in accordance with the present disclosure for mounting the die on the package is less. Moreover, as compared to the plating process, the present disclosure is less time consuming and less costly. Accordingly, avoiding the plating process reduces costs. The process described in accordance with the present disclosure can be used with headers and packages which are not gold plated or only very thinly gold plated. The use of the gold-tin sheet preform provides reliable die bonding with a minimum amount of gold.

Figure 2:
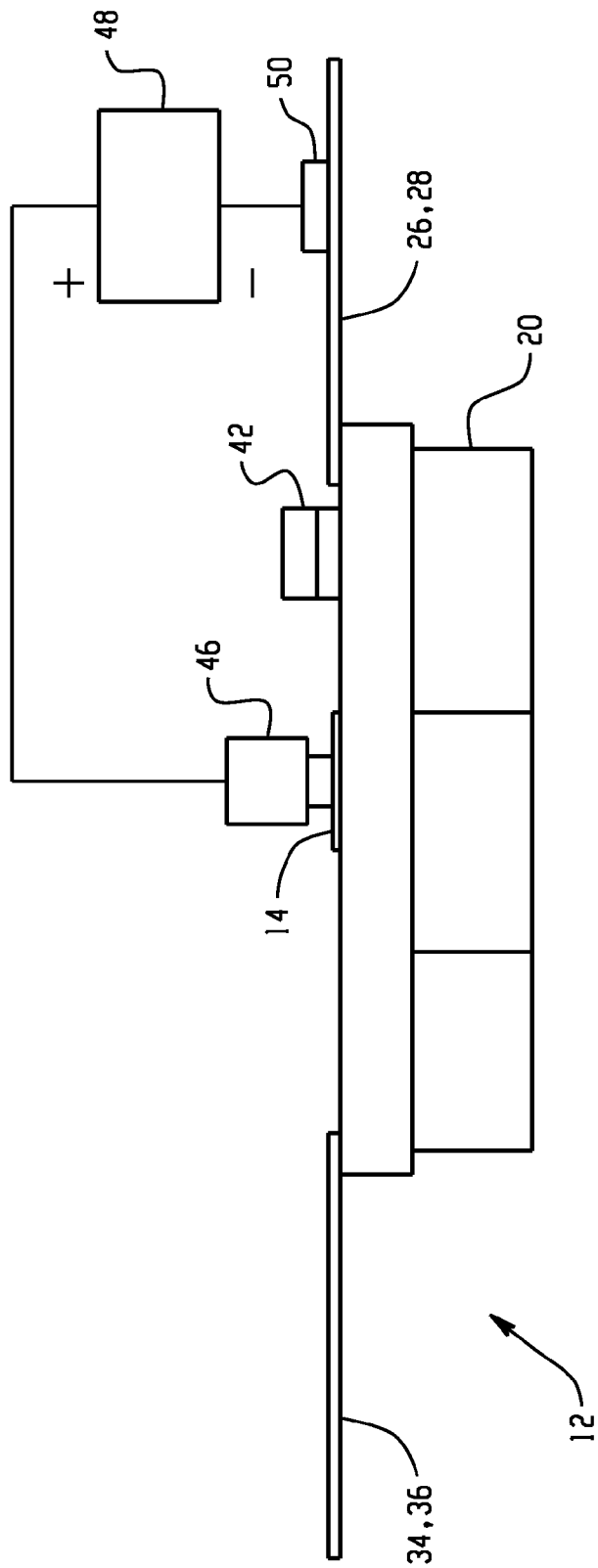
FIG. 2 is a combination cross section of the ceramic package of FIG. 1 and an electrical schematic of a method of spot welding the gold die bond strip to the ceramic package.

Turning now to FIG. 2, the preforms 14 are attached to the package 12 by tack welds 18. It will be appreciated that the tack welds 18 should be strong enough to keep the gold-tin die bond sheet preform 14 attached to the package 12 until a die is attached to the package. The tack welds 18 are formed using a tack welder having welding electrodes 46 (only one is schematically shown in FIG. 2), an electrical power supply 48, and a work piece contact 50. The work piece contact 50 is pressed onto the appropriate lead 26 or 28 and the electrodes 46 are pressed onto the corresponding gold-tin die bond preform 14 at the tack weld positions 18, as shown in FIG. 2. The welding electrodes 46 have working ends with a very small area of contact (e.g., 1 mm to 1.5 mm) when brought against the preform 14. This creates very small welds 18 between the preform 14 and the package 12.

Applicants have found that the welds 18 can be very small and still hold the preform in place because two spaced apart welds are created in each preform 14. Two small, spaced welds 18 reliably hold the preform 14 in place to prevent both lateral and rotational movement of the preform 14 relative to the package 12. In one embodiment, the welds are approximately 0.3 mm to 0.5 mm.

The gold-tin sheet for use in accordance with the present disclosure is originally a uniform mix of gold and tin. Gold-tin foil or sheet can be changed by melting and resolidification. For example, the gold and tin can separate in what is sometimes called phase separation. If this occurs to a large portion of the gold-tin sheet used to bond a die to a package, the bond may be compromised to the point of unreliability.

It will be appreciated that when the die is attached, the gold die bond sheet preform must at least partially liquefy and bond to both the die and the package. Accordingly, care should be taken to minimize phase separation issues during the spot welding.

In accordance with the present disclosure, phase separation issues are minimized by i) creating only very small weld areas (areas of melting), and ii) by applying welding current to the electrodes with a single principal current peak. Dual pulse resistance welding is performed to bond the gold-tin preforms onto the package.

In some spot welding approaches, a preheat current is applied prior to the current expected to create the weld. Applicants have found that these approaches can cause phase separation issues with a gold-tin preform.

In accordance with the present disclosure applicants concentrate current in one peak during the spot welding process to avoid phase separation issues that occur in other spot welding approaches.

Figure 3:
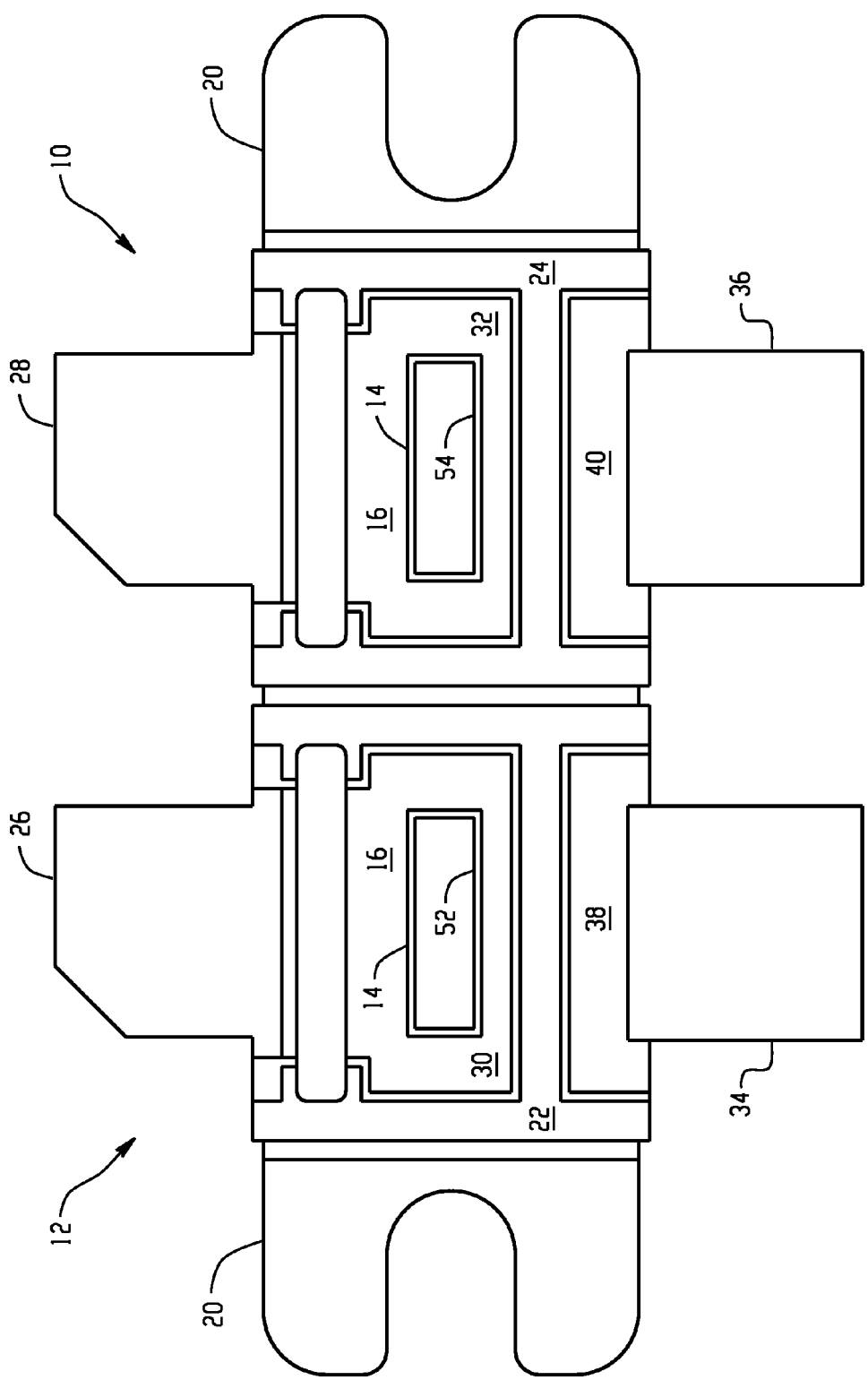
FIG. 3 is a top view of the ceramic package of FIG. 1 with a semiconductor chip or die bonded to the ceramic package.

FIG. 3 shows the package 12 after semiconductor chips 52 and 54 have been die bonded onto the package 12. In one particular embodiment the chips 52 and 54 cover about 98% of the area of the die bond sheet preforms 14.

While the gold-tin die bond sheet preform shown in the drawings is rectangular, the preform will be generally shaped to the contour of the bottom of the die. Virtually any desired shape preform can be used in accordance with the present disclosure.

Figure 4:
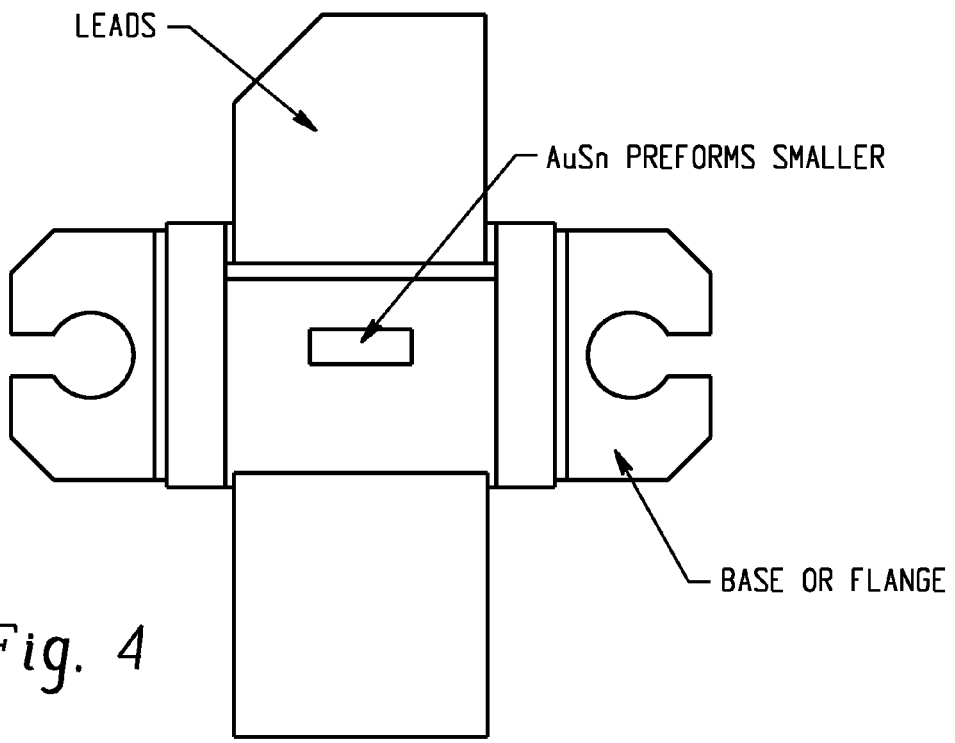
FIG. 4 is a top view of a second example package ready to receive a semiconductor chip or die with a gold-tin preform in place; and, FIG. 5 is a top view of a third example package ready to receive a semiconductor chip or die with a gold-tin preform in place.
Figure 5:
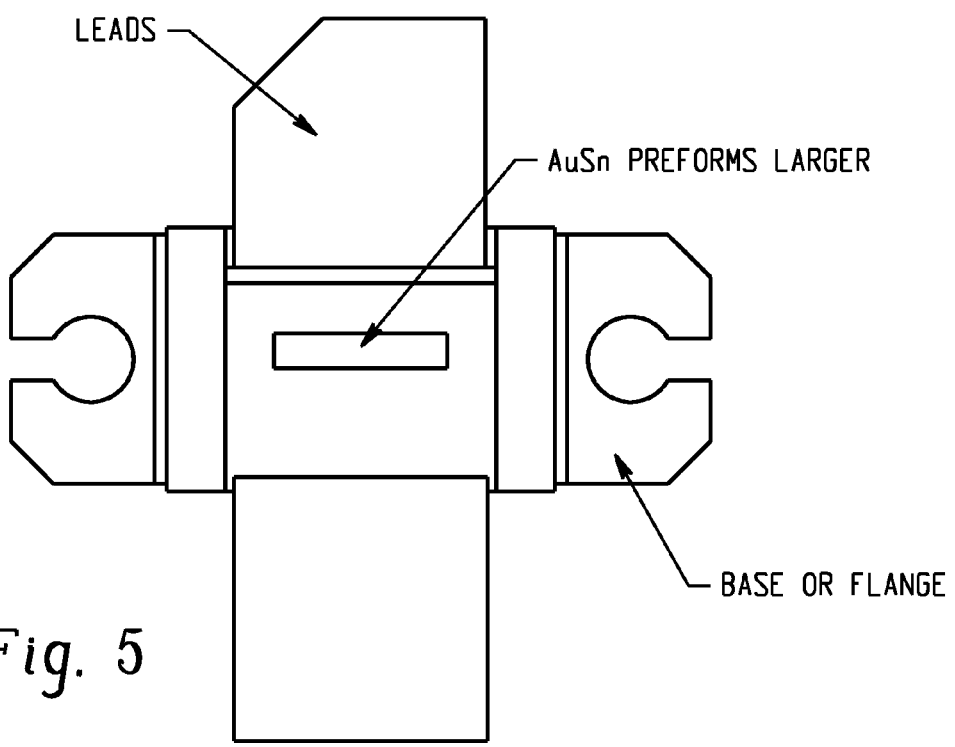

FIGS. 4 and 5 show examples of packages or headers with a gold-tin preform attached. A gold-tin sheet is first rolled or otherwise processed to a sheet of 0.0005" thick, for example. The gold-tin sheet is then cut to dimensions appropriate for the die to be mounted. For instance, a die size of 20 mm×1.2 mm might call for a preform measuring 2.1 mm×1.3 mm. The thickness can remain 0.0005" for all sizes. This size preform provides adequate solder volume for this size die.

It will be appreciated that the preforms 14 should be placed with precision in the location where the die is to be mounted to the package 12 so the solder (gold-tin) is where it can be used in bonding. Accordingly, very tight tolerances are used in preform attachment. This becomes very important when the die is placed for attachment. Often the die is placed on the package or header without pressure applied. If the preform on which the die is placed is not anchored, the die may move. In the illustrated embodiments, the preform is held in place by the tack welds such that the die does not move and is mounted at its intended location.

As described above, since the entire package does not have to have enough gold plating for reliably die bonding a chip to the package, the total amount of gold used on the package, including the gold-tin die bond sheet preform, is significantly reduced as compared to other method such as plating. Since the cost of manufacturing a custom thickness gold die bond sheet preform is much less than manufacturing a package with a custom thickness of gold plating, the cost of each of the packages for a new die type is reduced, which can become significant for small package orders by the semiconductor manufacturer.

While the disclosure has been described with reference to particular embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the scope of the disclosure.

Therefore, it is intended that the disclosure not be limited to the particular embodiments disclosed as the best mode contemplated for carrying out this disclosure, but that the disclosure will include all embodiments falling within the scope and spirit of the appended claims and the equivalents thereof.

The invention claimed is:

1. A method of forming a semiconductor bond site on a semiconductor package comprising the steps of:
    forming a gold containing die bond sheet preform having a width, a length and a substantially uniform thickness;
    placing the die bond sheet preform on a die bond area on a semiconductor package; and
    welding the die bond sheet preform to the package die bond area at two spaced apart spots, the two spaced apart spots having a total area significantly smaller than the area of the sheet preform.

2. The method of claim 1 wherein the die bond sheet preform contains gold and tin.

3. The method of claim 1 wherein the die bond sheet preform is about 0.0005 inch thick.

4. The method of claim 3, wherein the die bond sheet preform is rolled to a final thickness.

5. The method of claim 1 wherein the die bond sheet preform is welded to the package die bond area with an electric current resistance welding using a welding current waveform having only one principal current peak.

6. The method of claim 1, wherein the welding the die bond sheet preform to the package die bond area includes using a working electrode contact area of approximately 6.2 mm×2.39 mm.

7. The method of claim 1, further comprising placing a die on the die bond sheet preform.

8. The method of claim 7, further comprising attaching the die to the package die bond area by at least partially liquefying the die bond sheet preform.

9. The method claim 7, wherein the die bond sheet preform is slightly larger than a footprint of the die.

10. The method of claim 1, wherein the total area of the spot welds is approximately 0.3 mm to 0.5 mm.

11. A semiconductor package comprising a copper tungsten base having a die bond site and a die bond sheet preform containing gold and tin welded to the base die bond site in at least two locations spaced from one another.

12. The semiconductor package of claim 11, wherein the die bond sheet preform is a preform having a thickness of about 0.0005 inch.

13. The semiconductor package of claim 11, wherein the die bond sheet preform is spot welded to the base die bond site.

14. The semiconductor package of claim 13, wherein the at least two location comprise welds having an area of approximately 0.3 mm to 0.5 mm.

15. A semiconductor package formed by:
    forming a gold containing die bond sheet preform having a width, a length and a substantially uniform thickness;
    placing the die bond sheet preform on a die bond area on a semiconductor package;
    welding the die bond sheet preform to the package die bond area at two spaced apart spots, the two spaced apart spots having a total area significantly smaller than the area of the sheet preform.

16. The semiconductor package of claim 15, wherein the die bond sheet preform is about 0.0005 inch thick.

17. The semiconductor package of claim 15, wherein the die bond sheet preform is rolled to a final thickness.

18. The semiconductor package of claim 15, wherein the die bond sheet preform is welded to the die bond area with an electric current resistance welding using a welding current waveform having only one principal current peak.

19. The semiconductor package of claim 15, wherein the die bond sheet preform is spot welded to the die bond area.

20. The semiconductor package of claim 19, wherein the at least two spots comprise welds having an area of approximately 6.2 mm×2.39 mm.

* * * * *